United States Patent
Schricker et al.

(10) Patent No.: US 10,205,067 B2
(45) Date of Patent: Feb. 12, 2019

(54) LED WITH CERAMIC GREEN PHOSPHOR AND PROTECTED RED PHOSPHOR LAYER

(71) Applicant: Lumileds LLC, San Jose, CA (US)

(72) Inventors: April Dawn Schricker, Palo Alto, CA (US); Kim Kevin Mai, San Jose, CA (US); Grigoriy Basin, San Francisco, CA (US); Uwe Mackens, Aachen (DE); Joost Peter Andre Vogels, Leende (NL); Aldegonda Lucia Weijers, Eindhoven (NL); Karl Adriaan Zijtveld, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/170,442

(22) Filed: Jun. 1, 2016

(65) Prior Publication Data

US 2016/0276551 A1  Sep. 22, 2016

Related U.S. Application Data

(63) Continuation of application No. 14/414,719, filed as application No. PCT/IB2013/055752 on Jul. 12, 2013, now Pat. No. 9,379,293.
(Continued)

(51) Int. Cl.
*H01L 33/50* (2010.01)
*H01L 33/00* (2010.01)
(Continued)

(52) U.S. Cl.
CPC ........ *H01L 33/504* (2013.01); *H01L 33/0041* (2013.01); *H01L 33/508* (2013.01);
(Continued)

(58) Field of Classification Search
CPC .................. H01L 33/504; H01L 33/508
See application file for complete search history.

(56) References Cited

U.S. PATENT DOCUMENTS

| 7,344,902 B2 | 3/2008 | Basin et al. |
| 7,344,952 B2 | 3/2008 | Chandra |

(Continued)

FOREIGN PATENT DOCUMENTS

| CN | 101405646 A | 4/2009 |
| DE | 102010053362 A1 | 6/2012 |

(Continued)

OTHER PUBLICATIONS

Communication dated Apr. 26, 2016 from European Patent Application No. 13765788.8, 5 pages.
(Continued)

*Primary Examiner* — Ermias Woldegeorgis
(74) *Attorney, Agent, or Firm* — Volpe and Koenig, P.C.

(57) ABSTRACT

A ceramic green wavelength conversion element (120) is coated with a red wavelength conversion material (330) and placed above a blue light emitting element (110) such that the ceramic element (120) is attached to the light emitting element (110), thereby providing an efficient thermal coupling from the red and green converters (330, 120) to the light emitting element (110) and its associated heat sink. To protect the red converter coating (330) from the effects of subsequent processes, a sacrificial clear coating (340) is created above the red converter element (330). This clear coating (340) may be provided as a discrete layer of clear material, or it may be produced by allowing the red converters to settle to the bottom of its suspension material, thereby forming a converter-free upper layer that can be subjected to the subsequent fabrication processes.

8 Claims, 3 Drawing Sheets

Related U.S. Application Data

(60) Provisional application No. 61/673,810, filed on Jul. 20, 2012.

(51) Int. Cl.
 *H01L 33/60* (2010.01)
 *H01L 33/64* (2010.01)

(52) U.S. Cl.
 CPC ............ *H01L 33/60* (2013.01); *H01L 33/642* (2013.01); *H01L 2933/0041* (2013.01); *H01L 2933/0058* (2013.01)

(56) References Cited

U.S. PATENT DOCUMENTS

| | | | |
|---|---|---|---|
| 7,875,533 B2 | 1/2011 | Epler et al. | |
| 8,268,644 B2 | 9/2012 | Konno et al. | |
| 8,723,204 B2 | 5/2014 | De Carvalho Esteves et al. | |
| 2007/0215890 A1 | 9/2007 | Harbers | |
| 2010/0181582 A1 | 7/2010 | Li et al. | |
| 2010/0295079 A1 | 11/2010 | Melman | |
| 2011/0031516 A1 | 2/2011 | Basin et al. | |
| 2011/0049545 A1* | 3/2011 | Basin .................. | H01L 33/56 257/98 |
| 2011/0063850 A1 | 3/2011 | Oide et al. | |
| 2011/0090703 A1* | 4/2011 | Ishimori ............... | C04B 35/44 362/311.02 |
| 2011/0121331 A1 | 5/2011 | Simonian et al. | |
| 2011/0180780 A1 | 7/2011 | Yoo et al. | |
| 2011/0227476 A1* | 9/2011 | Zhang .................... | B32B 18/00 313/503 |
| 2012/0032217 A1 | 2/2012 | Yen | |
| 2014/0008683 A1 | 1/2014 | Petersen et al. | |

FOREIGN PATENT DOCUMENTS

| | | |
|---|---|---|
| JP | 2001291901 A * | 10/2001 |
| JP | 2004186488 A2 | 7/2004 |
| JP | 2007-266246 A | 10/2007 |
| JP | 2009-054801 A | 3/2009 |
| JP | 2009070869 A2 | 4/2009 |
| JP | 2010100743 A2 | 5/2010 |
| JP | 2012104531 A2 | 5/2012 |
| WO | 2011/010237 A1 | 1/2011 |

OTHER PUBLICATIONS

EPO as ISA, International Search Report and Written Opinion dated Nov. 27, 2013 from International Application No. PCT/IB2013/055752 filed Jul. 12, 2013, 10 pages.
Article 94(3) EPC dated Apr. 26, 2016, European Patent Application No. 13765788.8, 5 pages.
First Office Action dated Oct. 8, 2016, China Patent Application No. 201380038655.1, 17 pages.

* cited by examiner

LED WITH CERAMIC GREEN PHOSPHOR AND PROTECTED RED PHOSPHOR LAYER

CROSS-REFERENCE TO RELATED APPLICATIONS

The present application is a continuation of U.S. patent application Ser. No. 14/414,719 filed on Jan. 14, 2015, titled "LED WITH CERAMIC GREEN PHOSPHOR AND PROTECTED RED PHOSPHOR LAYER", which is a § 371 application of International Application No. PCT/IB2013/055752 filed on Jul. 12, 2013, which claims priority to U.S. Provisional Patent Application No. 61/673,810 filed on Jul. 20, 2012. U.S. patent application Ser. No. 14/414,719, International Application No. PCT/IB2013/055752, and U.S. Provisional Patent Application No. 61/673,810 are incorporated herein.

FIELD OF THE INVENTION

This invention relates to the field of light emitting devices, and in particular to a light emitting device that includes a light emitting element, a ceramic green-wavelength conversion element, and a red-wavelength conversion layer.

BACKGROUND OF THE INVENTION

Wavelength converters, such as phosphors, are commonly used to provide light comprising a plurality of wavelengths from a single wavelength light emitting element. The composite light output is commonly a combination of the light emitted from the converters upon absorption of some of the light emitting from the light emitting element, and the remainder of the non-absorbed light from the light emitting element.

In an example embodiment such as illustrated in FIG. 1A, the light emitting device 101 includes a light emitting element 110 that emits blue light and a ceramic element 120 above it that includes blue-to-green wavelength converter material. For ease of reference, a wavelength converter that emits green light, irrespective of the wavelength of the light absorbed by the converter, is hereinafter termed a green converter, the individual elements, or particles, that effect the conversion being termed green converter material. When the green converter material in the ceramic element 120 absorbs the blue light from the light emitting element 110, they emit green light. The composite light is closer to 'white' light than the blue light that is emitted from the light emitting element, and may be used for select applications, such as automotive headlights, that currently allow for a cool white illumination.

The ceramic element 120 allows for a fairly uniform and consistent distribution of green converter material through the element 120. The rigid nature of the ceramic composition of element 120 serves to provide permanence to this distribution of green converter material in element 120. The surface 125 of the ceramic element 120 may also be roughened to enhance the light output efficiency without significantly affecting the structure and characteristics of the element 120. The rigidity of the ceramic element 120 also facilitates the handling of the element for processes such as a pick-and-place process that situates the ceramic element 120 atop the light emitting element 110.

The light emitting element 110 with ceramic element 120 is encased in a reflective material 140, such as silicone loaded titanium oxide, TiO. The reflective material 140 serves to protect the light emitting device 101 and to reflect side emitted light from light emitting element 110 and ceramic element 120 to the surface 125 of the ceramic element 120, to provide a higher projection contrast (well defined boundary between illuminated and non-illuminated regions), which is preferred in certain applications, such as automotive lighting.

In a typical operating environment, the light emitting device 102 is coupled to a heat sink 160, which absorbs and dissipates the heat generated by the light emitter 110 and the green converters in the ceramic element 120. The ceramic element 120 is an efficient thermal conductor, but the surrounding atmosphere is not, and therefore only a small amount of the heat that is generated in the ceramic element 120 is dissipated. The heat that is generated by the conversion of blue light to green light will be conducted through the glue layer 115 and blue emitter 110 to the heat sink 160.

Although the composite light output of the light emitting device 101 is closer to a white output than the blue light from the light emitting element 110, some applications require a light output having a 'warmer' color temperature.

To provide a light that appears 'more white' (having a warmer color temperature) than the cool white light output of the device 101, a wavelength conversion element that emits red light ('red converter') may be added, as illustrated in the device 102 of FIG. 1B. Current technology, however, does not allow for red conversion material to be embedded in a ceramic element, and therefore a separate coating, such as a red converter material loaded silicone layer 130, is applied between the (blue) light emitting element 110 and the ceramic (green) converter element 120.

Although this arrangement of blue-red-green emitting elements of device 102 has a number of advantages, including providing a durable external surface 125, and a relatively high red converter efficiency, being adjacent the blue light emitting element 110, it exhibits poor thermal dissipation efficiency.

As noted above, although the ceramic layer 120 may dissipate some heat through the upper surface 125 to the surrounding atmosphere, the thermal transfer efficiency at this interface is poor. Compounding the matter, red converters generate more heat than green converters, having to effect a larger wavelength conversion. Although some of this heat will be transferred to the ceramic element 120, the ceramic element cannot efficiently dissipate this additional heat.

Accordingly, most of the conversion-generated heat must travel through the red converter layer 130 and the glue layer 115 to the emitter 110 and heat sink 160. The red converter layer 130 and the glue layer 115 are commonly silicone based, and silicone has a relatively low thermal transfer efficiency. Thus, the layers 130 and 115 will act as a thermal barrier to this required heat transfer. Thus, the expected operating temperature of the device of FIG. 1B will be high, increasing the likelihood of failure and reducing the device's life span.

SUMMARY OF THE INVENTION

It would be advantageous to provide a thermal efficient light emitting device that produces a warmer color temperature than the conventional blue light emitting element with ceramic green converter element. It would also be advantageous to provide a method of producing such thermal efficient light emitting devices that provides for a consistent color temperature among the devices.

To better address one or more of these concerns, in an embodiment of this invention, a green converter ceramic element is coated with a red converter loaded silicone and placed above a blue light emitting element such that the ceramic element is attached to the light emitting element, thereby providing an efficient thermal coupling from the red and green converters to the light emitting element and its associated heat sink. To protect the red converter coating from the effects of subsequent processes, a sacrificial clear coating is created above the red converter element. This clear coating may be provided as a discrete layer of clear material, or it may be produced by allowing the red converters to settle to the bottom of its suspension material, thereby forming a converter-free upper layer that can be subjected to the subsequent fabrication processes.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
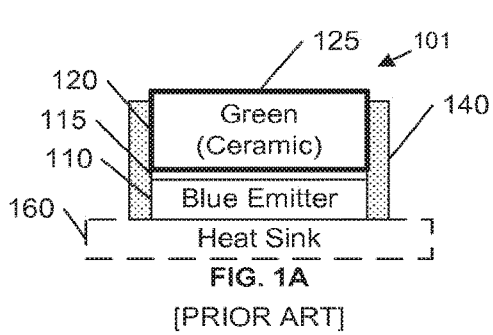
FIGS. 1A-1B illustrate example prior art light emitting devices with ceramic converter elements.
Figure 1B:
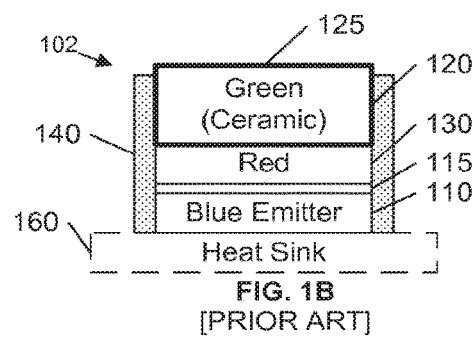
Figure 2:
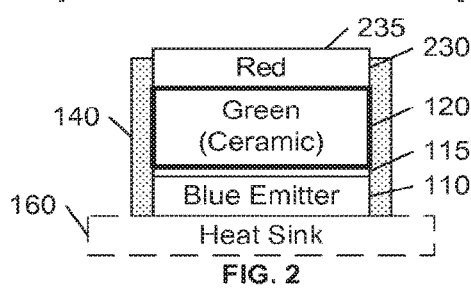
FIG. 2 illustrates an example light emitting device with ceramic converter element and protected red converter layer.

FIG. 2 illustrates an example light emitting device with a light emitting element 110, a ceramic green converter element 120, a protected red converter layer 230, and a protective reflective coating 140. In this example embodiment, because the ceramic green converter element 120 is a significantly better thermal conductor than the environment above the red converter layer 230, and because there is no glue, per se, between the red converter element 120 and the green converter element 120, heat from the red converter layer 230 will be efficiently conducted into the green converter element 120. This heat, and the heat caused by the conversion in the green converter element 120 are conducted through the glue layer 115 and the light emitting element 110 into the heat sink 160 upon which the device will be mounted.

As noted above, and as detailed further below, after attaching the converter element 120 and converter layer 230 to the light emitting element 110, the light emitting device is subject to subsequent fabrication processes, such as the removal of any residual materials on the surface 235 of the red converter layer 230, with a corresponding roughening of the surface 235 to increase the light extraction efficiency. These processes include, for example, micro-bead blasting, which removes surface material by projecting small particles onto the surface at high velocity. Currently a 'dry' blasting process is commonly used, wherein air and particles of baking soda (about 80 microns in diameter) are projected onto the surface, although 'wet' blasting, wherein a slurry of water and plastic particles (about 180 microns in diameter) is projected onto the surface.

When a durable material, such as the ceramic element 120, is subjected to micro-bead blasting, the surface is gradually worn away; this gradual reduction allows for the micro-bead blasting to be controlled to a fairly high precision. When a less durable material, such as a silicone layer 230 that is embedded with converter elements is subjected to micro-bead blasting, the surface is worn away quickly, allowing for only a relatively coarse control of the degree of reduction.

If the red converter layer 230 is subjected to micro-bead blasting with only coarse control of the degree of reduction, the variance in light output among devices will be large. In some devices, only a small amount of the red converters will be removed by the micro-bead blasting; in other devices a larger amount of red converters will be removed by the micro-bead blasting. The quantity of red converter material that remains in the red converter layer 230 will determine the amount of red light that will be produced, and thereby determine the color point of the composite light output. If the quantity of remaining red converter material varies significantly among devices due to the lack of control of the micro-bead blasting effects on the converter loaded silicone, the color point among the devices will correspondingly vary.

In a preferred embodiment of this invention, the red converter layer 230 is formed such that the amount of red converters in the layer 230 is fairly consistent among devices, despite the lack of precise control of the effects of micro-bead blasting, and other processes, applied to the device. This consistent amount of red converter material is maintained by providing a sacrificial converter-free (clear) layer to protect the layer that contains the red converter material from damage during subsequent processes. When the micro-bead blasting, or other process, is applied that wears down or otherwise damages the upper surface, the reduction in material will not introduce a corresponding reduction in the amount of red converter material, because the material will be removed from the non-converter-containing sacrificial layer. Typically, the sacrificial layer will be transparent to the any of the wavelengths of light generated by the converters 120, 230 or the emitter 110. One of skill in the art will recognize, however, that the sacrificial layer may be sized to provide a remainder layer after it is worn down that serves to provide other effects, such as scattering, and need not be clear, per se.

Figure 3A:
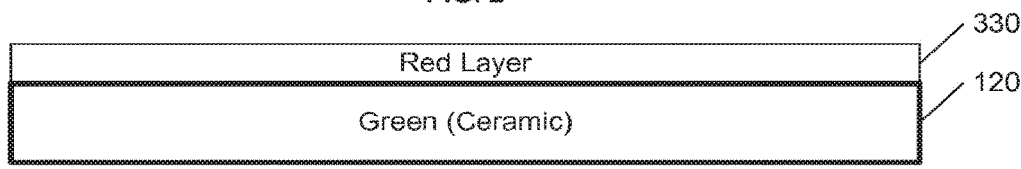
FIGS. 3A-3C illustrate an example process for creating a protected red converter layer on a ceramic green converter element.
Figure 3B:
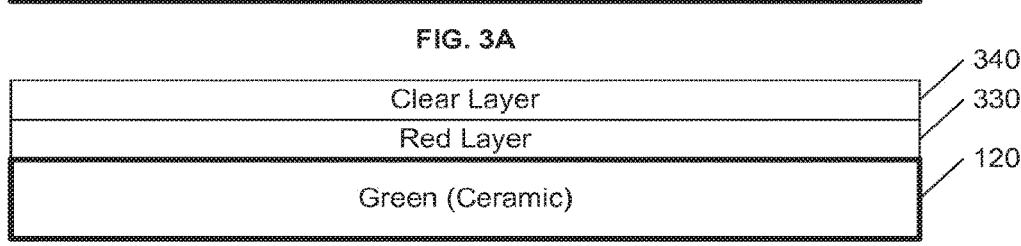
Figure 3C:
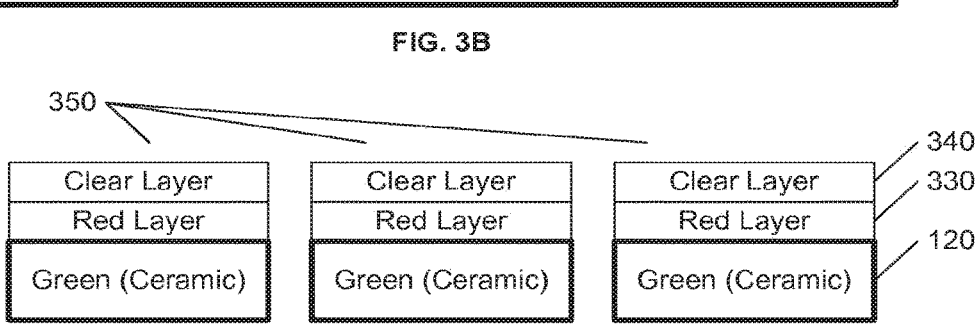

FIGS. 3A-3C illustrate an example process for creating a protected red converter layer 330 on a ceramic green converter element 120. In FIG. 3A, a red converter layer 330 is applied to the ceramic element 120 using any of a variety of application techniques, including lamination of blade coated film, screen printing, stencil printing, spin cast, or any other suitable method, screen printing typically being preferred. The red converters in the layer 330 may include, for example, BR102C, a-Sialon, BSSN2.0, BSSN2.6, and BSSNE2.6, and the green converters in the ceramic element 120 may include YAG, LuYAG, NYAG1, 2, and so on. The red converters may be suspended in any suitable material, including any variety of silicone, silicon oxide sol gel, and others known in the art. For ease of reference, the term 'silicone' is used herein to include such materials.

Although the aforementioned 'fluid' techniques for directly applying a red converter layer 130 on the green converter element are very well suited for this application, one of skill in the art will recognize that other techniques may be used as well. For example, U.S. Pat. No. 7,344,952, "Laminating Encapsulant Film Containing Phosphor Over LEDs", issued 3 Jul. 2008 to Haryanto Chandra, and incorporated by reference herein, discloses a technique for laminating a phosphor film to a set of light emitting devices on a submount. A similar technique may be used for creating the red converter layer 330 as a preformed film, then laminating this film to a set of ceramic elements 120. In like manner, although the use of a glue will reduce the thermal efficiency somewhat, one of skill in the art will recognize that preformed red converters may be glued to the ceramic element 120.

In an embodiment of this invention, the thickness of the converter layer 330 may be between 5 and 50 microns, typically about 30 microns, and the concentration of the red converters in this layer may be between 1% and 70%, typically between 7% and 20%. If silicone is used as the suspension material, a schedule of curing may be 1 hr at 80° C., followed by 1 hr at 120° C., and then followed by 4 hr at 150° C.

In FIG. 3B, a clear non-converter containing sacrificial layer 340 is created above the red converter layer 330. This sacrificial layer 340 may include, for example, silicone compounds KJR9222A/B and KRJ9226D, as well as other materials. Preferably, the sacrificial layer 340 has the same refraction index as the red converter layer 330, to avoid losses at the boundary between the layers 330, 340. The sacrificial layer 340 may be formed over the red converter layer 330 using any of a variety of techniques, including, for example, screen printing, lamination, overmolding, casting, or any other suitable method.

To facilitate the formation of the sacrificial layer 340 over the converter layer 330, the converter layer 330 may be subjected to treatments, such as oxygen plasma, UV ozone, and the like, typically for between 2 and 30 minutes. To maximize the effectiveness of this treatment, the delay between the treatment and the formation of the sacrificial layer, if any, should not exceed a few hours.

The thickness of the sacrificial layer 340 will be dependent upon the expected degree of control of the effects of micro-bead blasting, or other processes that reduce the thickness, and may range from 2 to 100 microns. Assuming conventional processing techniques, a sacrificial layer thickness of 20-40 microns will generally be sufficient. If silicone is used as the sacrificial material, a schedule of curing may be 1 hr at 80° C., followed by 1 hr at 120° C., and then followed by 4 hr at 150° C.

The concentration of red and green converter material in the layer 330 and ceramic element 120, respectively, and the thickness of the layer 330 and ceramic element 120 will primarily determine the resultant color point of the composite light output. Accordingly, the variance of color point among devices will primarily be determined by the degree of control of these concentrations and thicknesses, which is typically substantially greater than the degree of control of the effects of other processes, such as micro-bead blasting.

After forming the red converter layer 330 and sacrificial layer 340 on the ceramic element 120, the combination is diced, or 'singulated', to produce individual ceramic based wavelength converter elements 350. As noted above, an advantage of a ceramic based structure is that it is rigid enough to facilitate efficient picking and placing of these structures as required during subsequent processes.

FIGS. 4A-4D illustrate an example process for creating light emitting devices with a ceramic green converter element and protected red converter layer.

Figure 4A:
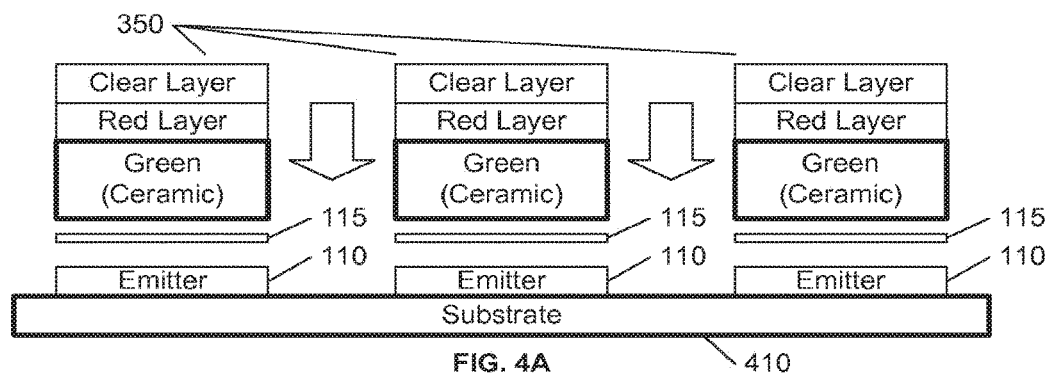
FIGS. 4A-4D illustrate an example process for creating light emitting devices with a ceramic green converter element and protected red converter layer.
Figure 4B:
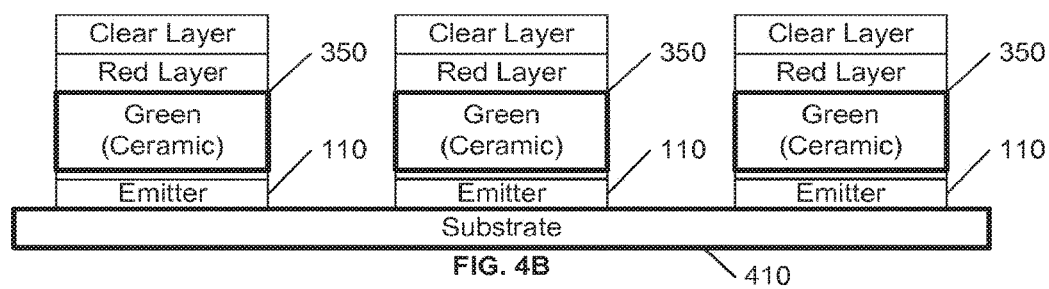

Having formed a plurality of ceramic based wavelength converter elements 350, these converter elements 350 are attached to a plurality of light emitting elements 110, as illustrated in FIGS. 4A-4B. To facilitate this process and subsequent processes, the light emitting elements 110 may be mounted on a substrate 410. This substrate 410 may include electrical circuitry that facilitates external connections to the light emitting elements 110.

Figure 4C:
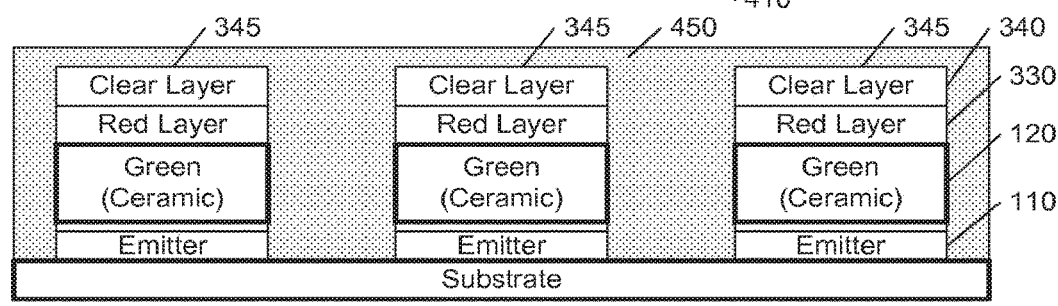

After the ceramic based converter elements 350 are attached to the light emitting elements 110, protective and reflective material 450, such as silicone loaded with TiO, may be pressed into the space between these elements 110, 350 using an over moulding technique. To facilitate manufacture, the material 450 may be applied as a coating that covers all of the elements 110, 350 and fills the space between them, as illustrated in FIG. 4C.

To remove the covering reflective material 450 from the light emitting surface 345, the devices on the substrate 410 may be subjected to a micro-bead blasting process, or other process that damages the exposed surfaces of the device. In the context of this disclosure, the term 'damage' includes any wearing away or abrasion on the exposed surface, even though this damage may have a beneficial effect. For example, depending upon the size of the micro-beads and other factors, the process may provide a roughened surface 345a, 345b, 345c on the exposed layers 340a, 340b, 340c, which may improve the light extraction efficiency through this surface.

Figure 4D:
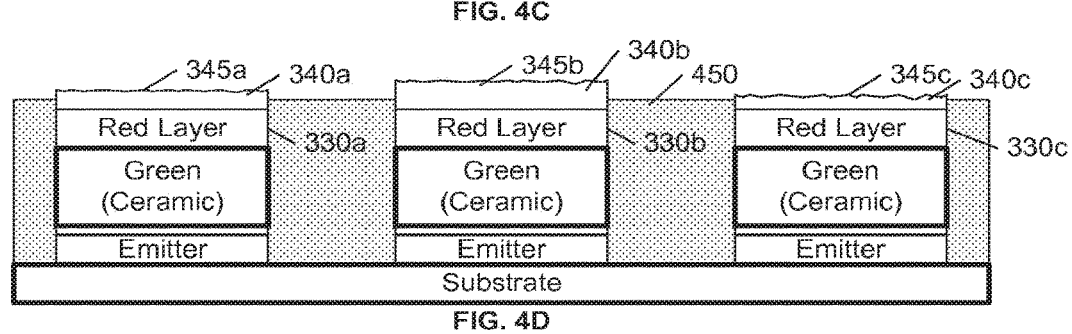

As noted above, such a process is also likely to have different effects on the exposed layers 340a, 340b, 340c of the devices, due to the coarse nature of the control of these effects on relatively non-durable material, such as silicone, as illustrated in FIG. 4D.

It is significant to note that although this subsequent processing has differing effects on the different layers 340a, 340b, 340c, the red converter layers 330a, 330b, 330c, are unaffected by this subsequent processing, being protected from damage by the sacrificial layers 340a, 340b, 340c. Accordingly, the color point among the devices will not be dependent upon the variances associated with these subsequent processes.

FIGS. 5A-5E illustrate an example alternative process for creating light emitting devices with a ceramic green converter element and protected red converter layer.

Figure 5A:
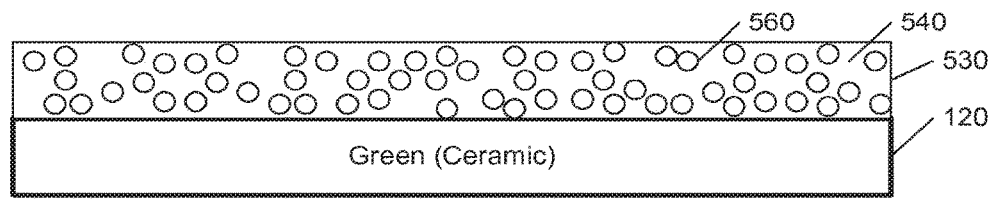
FIGS. 5A-5E illustrate an example alternative process for creating light emitting devices with a ceramic green converter element and protected red converter layer.
Figure 5B:
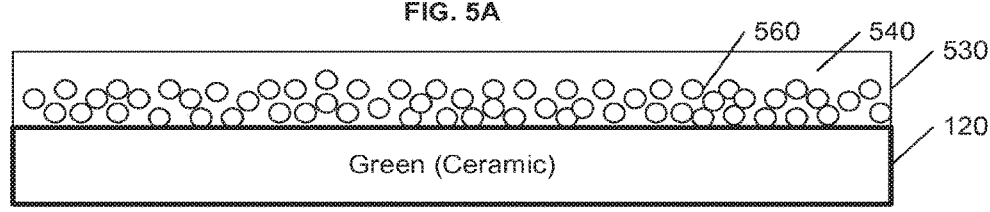

FIG. 5A illustrates an example application of a thick red converter layer 530 upon a ceramic green converter element 120. The thickness of the layer 530 will generally range between 30 and 150 microns, 50-80 microns being most common. Red converter layer 530 may consist of suspension material 540 which is embedded with red converter material 560. In accordance with an aspect of this invention, the suspension material 540 is viscous, and the red converter material 560 is able to 'sink' or settle down to the bottom of the layer before the suspension material 540 is fully cured, as illustrated in FIG. 5B. This sinking, or settling, of the red converter material 560 create an upper region of the suspension material 540 that does not contain red converter material 560, and a lower region that contains the original red converter material 560 in a denser form.

The sedimentation time to achieve a given depth of the non-converter region will be dependent upon the viscosity of the suspension material 540, the density of the red converter material 560, the concentration of the red converter material 560 in the suspension material 540, the charge of the particles of red converter material 560, and other factors. The concentration of red converter material 560 in the suspension material 540 will generally be between 1% and 70%, although concentrations below 25% are most common.

The amount of red converter material 560 needed to convert the light to the correct color point is based on the target color point and the light emitted from the blue emitter and the green converter material. The amount of red converter material 560 in the converter layer 530, and thus the degree of red conversion, can be controlled by controlling the total thickness of the converter layer 530, and the sedimentation time.

When the material 560 sinks to create an appropriately deep region (e.g. 20-40 microns) of non-converter material, the suspension material 540 is cured, thereby stabilizing the distribution of red converter material 560 in the suspension material 540. If silicone is used as the suspension material 540 in the converter layer 530, a schedule of curing may be 1 hr at 80° C., followed by 1 hr at 120° C., and then followed by 4 hr at 150° C., although a cure as short as 25-60° C. for one hour may be sufficient, depending upon the particular makeup of the converter layer 530.

One of skill in the art will recognize that trace amounts of the converter material 560 may exist in the upper region of the converter layer 530. In the context of this disclosure, a layer/region with a concentration that is an order of magnitude less than the concentration in the lower layer/region with settled converter material is considered to be a non-converter layer/region.

Figure 5C:
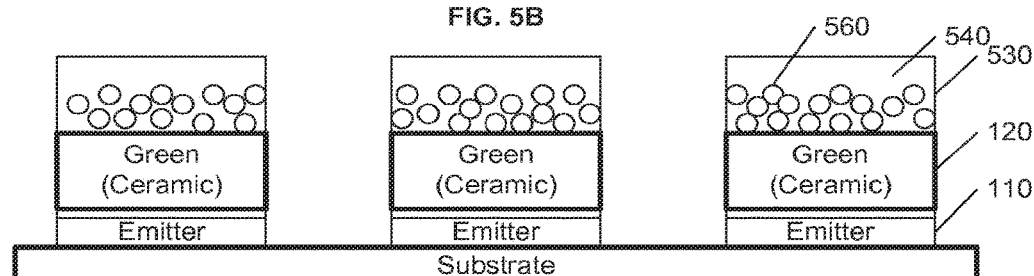
Figure 5D:
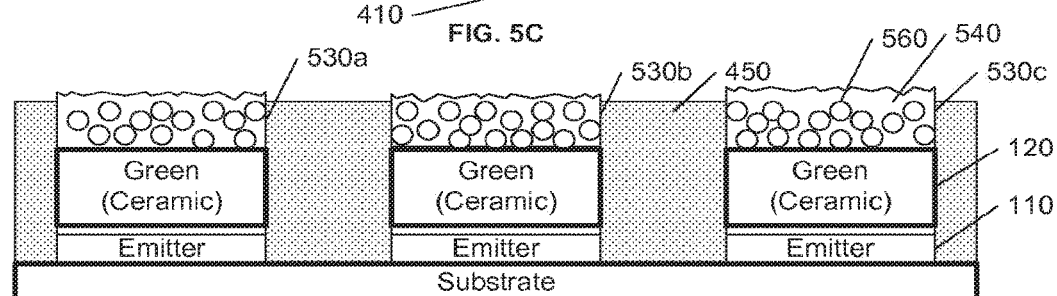

The ceramic elements 120 with converter layer 530 are attached to light emitting elements 110, at FIG. 5C, and a protective and reflective material 450 is applied to fill the spaces between the elements 110 with ceramic converter element 120 and layer 530.

The excess of material 450 is removed, typically via a micro-bead blasting or other material removal process. This removal process may result in different removal effects (damage) on each of the converter layers 530a, 530b, 530c, as illustrated by their different heights and patterns of roughness in FIG. 5D. However, provided that the removal process only affects the non-converter region of these converter layers 530a, 530b, 530c, these removal differences will have minimal, if any, effect on the color point produced by the red converter material 560a, 560b, 560c in the remaining portion of layers 530a, 530b, 530c.

Figure 5E:
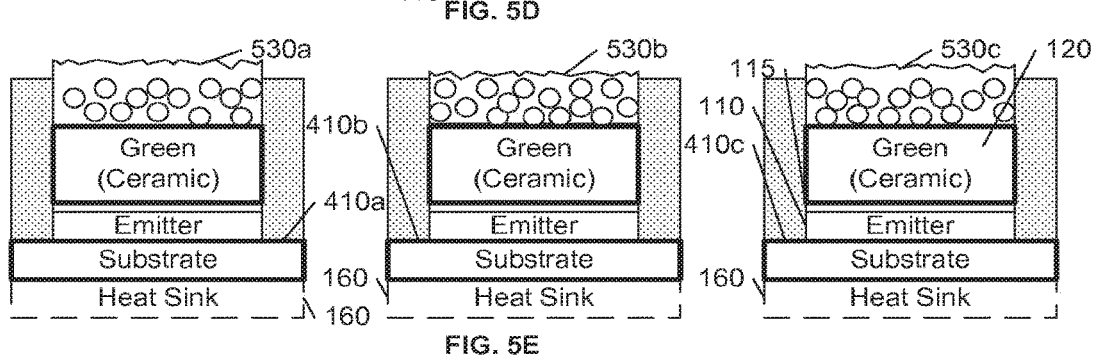

As illustrated in FIG. 5E, the devices on the substrate 410 are diced/singulated to provide individual light emitting devices on substrates 410a, 410b, 410c. As noted above, although these individual light emitting devices have differing converter layers 530a, 530b, 530c, the converter concentration within each converter layer 530a, 530b, 530c, is substantially the same, being unaffected by the variances associated with the processes applied after the converter layers 530a, 530b, 530c are attached to the ceramic elements 120 and light emitting elements 110.

In operation, the substrate 410 is coupled to a heat sink 160, so that the heat generated at the red converter layer 530 and the green converter element 120 is conducted through the ceramic green converter element 120, through the glue layer 115, the light emitting element 110, and the substrate 160, and is dissipated through the heat sink 160. Optionally, the substrate 410 may be removed, or the substrate 410 may include the heat sink 160.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light emitting device comprising:
a substrate, the substrate having a first surface and a second surface opposite the first surface, the first surface forming a first outer surface of the light emitting device;
a light emitting element configured to emit light having a first wavelength, the light emitting element being disposed adjacent the second surface of the substrate;
a ceramic wavelength conversion element formed from a first wavelength conversion material that converts light incident thereon from the light emitting element to light having a second wavelength different from the first wavelength, the ceramic wavelength conversion element having a first surface adjacent the light emitting element and a second surface opposite the first surface;
a layer of adhesive material disposed between the light emitting element and the first surface of the ceramic wavelength conversion element;
a coating of a second wavelength conversion material disposed on the second surface of the ceramic wavelength conversion element, the second wavelength conversion material converting light incident thereon to light having a third wavelength different from the first wavelength and the second wavelength and having a first surface adjacent the ceramic wavelength conversion element and a second surface opposite the first surface; and
a continuous layer of sacrificial material having a first surface, a second surface opposite the first surface, and a plurality of side surfaces, the first surface of the sacrificial material forming a second outer surface of the light emitting device, the second surface of the sacrificial material being disposed in direct contact with the second surface of the coating of the second wavelength conversion material, and the sacrificial material being transparent to light having the first, second and third wavelengths.

2. The device of claim 1, further comprising a reflective material in direct contact with side surfaces of each of the light emitting element, the ceramic wavelength conversion element, the layer of the second wavelength conversion material and the sacrificial material.

3. The device of claim 2, wherein the reflective material comprises titanium oxide (TiO) mixed with silicone.

4. The light emitting device of claim 1, wherein at least a region of the sacrificial material is roughened.

5. The device of claim 1, wherein the light emitting element emits blue light, the first wavelength conversion material is a blue-to-green wavelength conversion material, and the second wavelength conversion material includes a blue-absorbing red-emitting material.

6. The device of claim 1, wherein the sacrificial material comprises silicone.

7. The device of claim 1, wherein the layer of the second wavelength conversion material has a thickness between 5 and 50 microns and the sacrificial material has a thickness between 2 and 100 microns.

8. The device of claim 1, further comprising:
a substrate; and
a heat sink,
wherein the light emitting element is disposed on the substrate, and the substrate is disposed on the heat sink.

* * * * *